United States Patent [19]

Ohkawa et al.

[11] Patent Number: 4,723,250
[45] Date of Patent: Feb. 2, 1988

[54] SOLID STATE CYCLOTRON LASER

[75] Inventors: Tihiro Ohkawa, La Jolla; Yuh-Ren Lin-Liu, San Diego; Hiroyuki Ikezi, Rancho Santa Fe, all of Calif.

[73] Assignee: GA Technologies Inc., San Diego, Calif.

[21] Appl. No.: 811,644

[22] Filed: Dec. 20, 1985

[51] Int. Cl.⁴ .................. H01S 3/00; H01S 3/19; H01L 33/00; H01L 27/22
[52] U.S. Cl. ........................... 372/37; 357/17; 357/27; 372/4; 372/20; 372/44
[58] Field of Search ............ 372/4, 2, 20, 37, 44, 372/50, 43; 357/27, 61, 35, 17

[56] References Cited

U.S. PATENT DOCUMENTS 3,986,194 10/1976 Masumoto et al. ............... 372/44
4,376,917 3/1983 Ganguly et al. ............... 331/94.1

OTHER PUBLICATIONS

Gornik, "Tunable for Infrared Sources Based on Landau Level Transitions", Optics and Laser Technology, Jun. 1975, vol. 7, No. 3, pp. 121-126.
J. Schneider, "Stimulated Emission of Radiation by Relativistic Electrons in a Magnetic Field", *Phys. Rev. Lett.,* 2, 504, (1959).
B. Lax, "Cyclotron Resonance and Impurity Levels in Semiconductors", Published in Quantum Electronics, Columbia Univ., Press, N.Y., (1960), p. 428.
Heiblum, et al., "Direct Observation of Ballistic Transport in GaAs", Phys. Rev. Lett. 55, 2200, (1985).

*Primary Examiner*—James W. Davie
*Assistant Examiner*—Georgia Y. Epps
*Attorney, Agent, or Firm*—Fitch, Even, Tabin & Flannery

[57] ABSTRACT

A solid state cyclotron laser device generate coherent electromagnetic radiation. A semiconductor configuration comprises an emitter region and a collector region separated by a base region and barrier layers on each side of the base. The semiconductor configuration is biased such that electrons enter the base region from the emitter region as hot electrons. A magnetic field applied by an external source to the base region causes the hot electrons to gyrate and quantize into Landau levels. An optical resonance cavity produces standing wave modes which stimulate the electrons to move from higher to lower Landau levels to generate conherent radiation. Electrons with decreased energy are removed at the collector in order to maintain the population inversion. The device is tunable by adjusting the magnetic field.

8 Claims, 5 Drawing Figures

SOLID STATE CYCLOTRON LASER

This invention relates to lasers and in particular to solid state lasers.

BACKGROUND OF THE INVENTION

A need exists for an inexpensive, lightweight, tunable laser radiating in the far infrared wavelengths. There are many gas lasers available in the far infrared wavelengths; however, they are not tunable. Free electron lasers are tunable, but they are expensive and bulky.

It has been suggested that stimulated emission by relativistic electrons gyrating in a magnetic field might be possible if there were an overpopulation of electrons in the upper energy states. See J. Schneider, Stimulated Emission of Radiation by Relativistic Electrons in a Magnetic Field, Phys. Rev. Lett. 2, 504 (1959). A gyrotron in which electrons gyrate in a vacuum would be tunable, but wavelengths produced would be much longer than infrared wavelengths.

B. Lax, in "Cyclotron Resonance and Impurity Levels in Semiconductors," (Quantum Electronics, edited by Charles H. Townes, Columbia University Press (New York, 1960), p. 428, proposed to use indium antimonide, InSb, which has a nonparabolic conduction band and small effective electron mass to produce coherent radiation. However, his idea of making a population inversion by optical pumping is apparently inoperable because the lifetime of electrons in the Land levels is too short.

Ganguly, et al., in U.S. Pat. No. 4,376,917, have suggested a device for injecting electrons in indium antimonide to make a cyclotron maser. Although the Ganguly device may create hot electrons, it apparently does not provide for an electron population inversion.

Heiblum, et al., have recently presented the first direct evidence of ballistic electrons in a thin gallium arsenide, GaAs, layer disclosing an overpopulation of electrons in the upper energy states. See (Heiblum, et al., "Direct" Observation of Ballistic Transport in "GaAs", Phys. Rev. Lett. 55, 2200 (1985)).

SUMMARY OF THE INVENTION

The present invention is a solid state device capable of generating coherent electromagnetic radiation. A semiconductor configuration comprises an emitter region and a collector region separated by a base region and barrier layers on each side of the base region. The semiconductor configuration is biased such that electrons enter the base region from the emitter region as hot electrons. A magnetic field applied by an external source to the base region causes the hot electrons to gyrate and quantize into Landau levels. The frequency of gyration is the cyclotron frequency $\omega_c$ determined by $$w_c = \frac{eB}{m_e c}$$

where e is the charge on an electron, B is the magnetic field, c is the speed of light and $m_e$ is the effective mass of the electron. An optical resonance cavity produces standing wave modes which stimulate the electrons to move from higher to lower Landau levels to generate coherent radiation. Electrons with decreased energy are removed at the collector in order to maintain the population inversion. Low energy majority carriers are prevented from moving from the emitter region to the base region and from the base region to the collector region by the barrier layers. The device is tunable by adjusting the magnetic field.

With easily obtainable magnetic fields coherent infrared radiation can be obtained because of the decreased effective mass of electrons gyrating in the base region. The present invention is advantageous in that it provides an inexpensive, lightweight, tunable laser radiating in the far infrared wavelengths.

DETAILED DESCRIPTION OF PREFERRED EMBODIMENT

Figure 1:
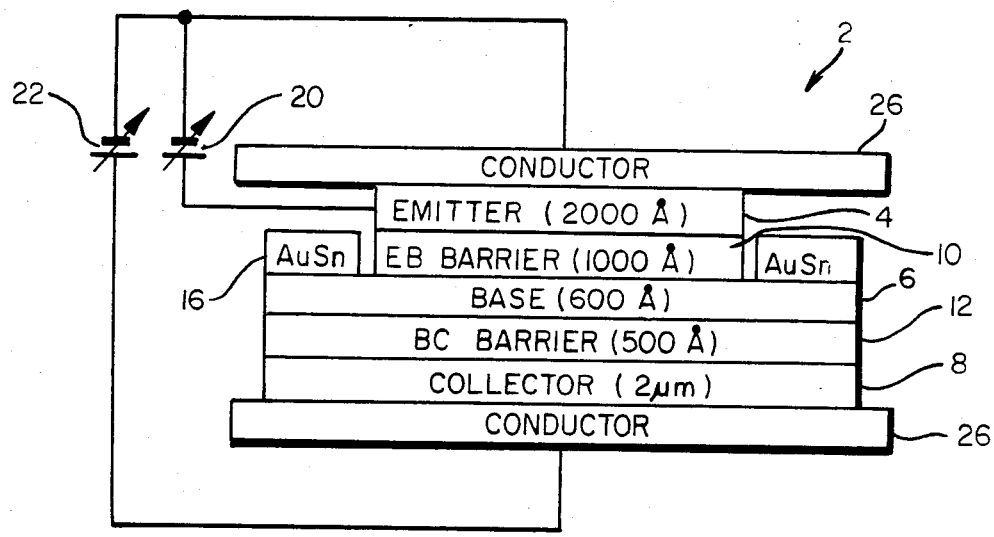
FIG. 1 is a schematic, including a front view of the semiconductor portion, of one preferred embodiment of the present invention.
Figure 2:
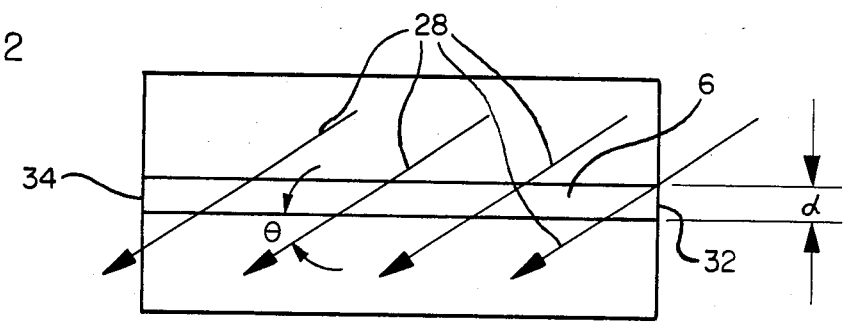
FIG. 2 is a side view of a portion of the device shown in FIG. 1 showing the field lines of magnetic flux applied to the base region and showing locations of mirrors forming an optical resonant cavity.

A preferred embodiment of this invention is illustrated in FIG. 1 and FIG. 2. A semiconductor configuration 2 comprises an emitter 4, a base 6, and a collector 8. An EB (emitter-base) barrier layer 10 separates the emitter 4 and the base 6, and a BC (base-collector) barrier 12 separates the base 6 and the collector 8. The semiconductor configuration 2 is enclosed on the top and bottom by conducting walls 26. Variable power sources 20 and 22 bias the base 6 and the collector 8, respectively, with respect to the emitter 4 by connection to the conducting walls 26 and ohmic contacts 16.

An external magnetic field represented by field lines 28 make an angle $\theta$ with the planes defining the base region 6 as shown in FIG. 2.

A Fabry-Perot resonant cavity is formed in the base 6 by mirrors 32 and 34. The mirror 34 permits passage of a small fraction of the coherent radiation produced in the resonant cavity.

Figure 3:
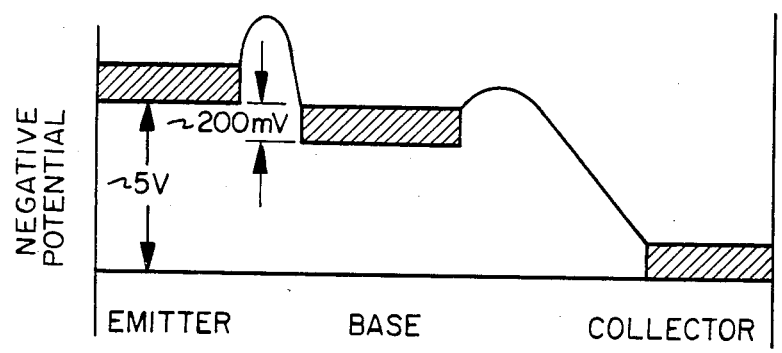
FIG. 3 is an energy diagram showing the conduction bands of the device shown in FIG. 1.

An energy diagram of the conduction bands of the device is illustrated in FIG. 3.

In the preferred embodiment the emitter 4, base 6, and collector 8 are formed of parallel layers of n-type InSb semiconductor crystal. The thicknesses of these elements are approximately 2000 Å, 600 Å, and 2 $\mu$m respectively as shown in FIG. 1.

The emitter 4 is biased negatively with respect to the base by a bias voltage $V_{EB}$ from the variable power source 20. In the example shown in FIG. 3, the bias $V_{EB}$ is 200 mV. The EB barrier layer 10 is made of $InGa_{0.7}Sb_{0.3}$ and has a thickness of about 1000 Å. Electrons in the emitter 4 tunnel the EB barrier layer 10 and then enter the base 6 as hot electrons having energies of $eV_{EB}$, where e is the charge on an electron and $V_{EB}$ is the biasing voltage.

The magnetic field 28 is applied obliquely to the base 6 as shown in FIG. 2. The electrons move through the semiconductor crystal of the base 6 and gyrate about the magnetic field lines. They are quantized into Landau levels. When the angle, $\theta$, between layer plane and magnetic field is small, the major part of the injected electron energy goes to perpendicular motion, so that higher Landau levels are populated. As the electrons radiate energy, they go to lower Landau levels.

The electrons entering the base 6 from the emitter 4 are drawn through the base 6 to the collector 8, which is biased positively with respect to the base 6 by the power source 22. The purpose of the BC barrier layer 12 is to prevent low energy majority carriers in the base 6 from moving into the collector 8. The thickness of the BC barrier level 12 is several hundred Å, preferably about 500 Å, so that the tunneling probability of low energy electrons is small. Electrons having energies in the intermediate ranges are drawn out of the base 6 to reach the collector 8. This maintains the population inversion. Many barrier-bias designs which are variations of that described above could be used. These alternate designs will be apparent to persons skilled in the art. The objective is to assure that (1) current flow of low energy (majority carrier) electrons is relatively low, (2) the flow of the high energy electrons from the emitter to the base is relatively great, and (3) the flow out of the base of intermediate energy electrons is relatively great.

Figure 4:
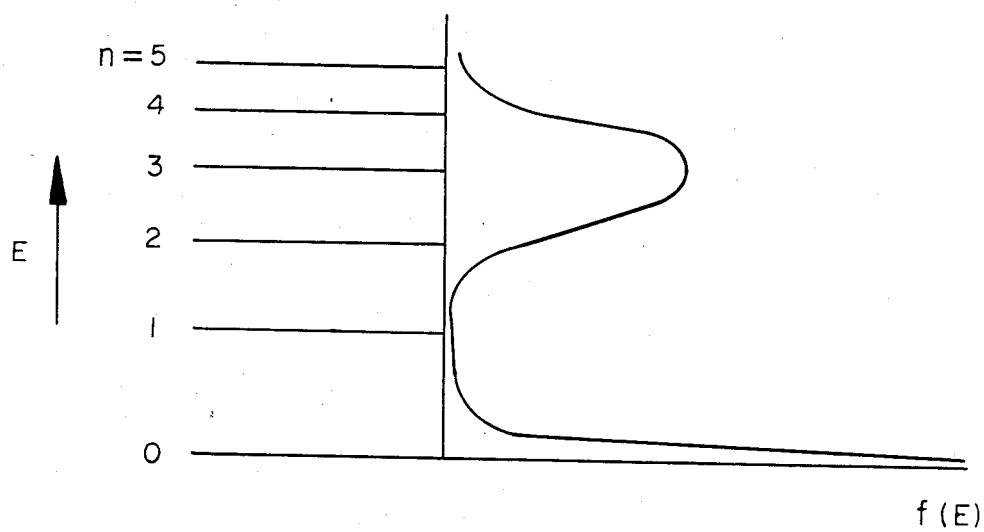
FIG. 4 is a graph showing Landau levels of InSb.
Figure 5:
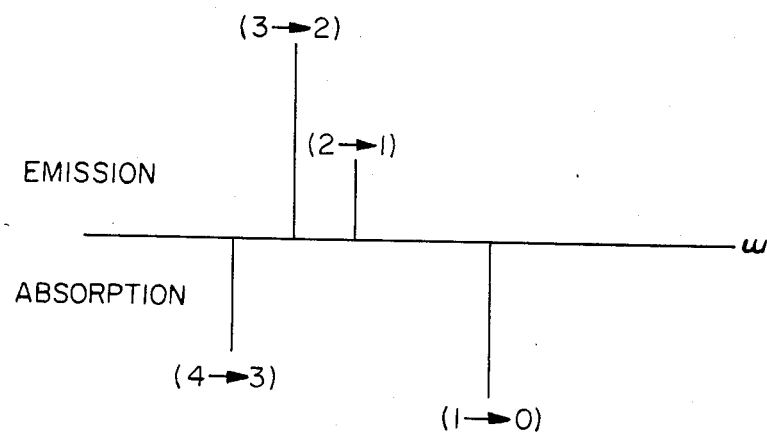
FIG. 5 is a graph showing the frequencies of electromagnetic emission and absorption in a preferred embodiment of the present invention.

FIG. 4 (left side) schematically shows the Landau levels spaced unevenly due to nonparabolic energy bands of InSb and the population density f(E) in the base of this preferred embodiment of this invention. FIG. 4 (right side) shows the electron population in the base as a function of energy. The lowest level, the quantum number n=0, is highly populated by the majority carriers. (The impurity levels are not shown in the diagram.) The population f(E) peaks around n=3 in this preferred embodiment. The selection rule allows the transitions which change n by one. Because the spacing of the levels is uneven, the frequencies of photon matching the transitions (n+1, n) depends on n as shown in FIG. 5. Lasing can occur beween the combination (3,2) and lasing can occur between combination (2,1) because population is inverted. The combination (1,0) absorbs a photon, but it does not hurt the lasing at (3,2) because the absorption occurs at a different frequency.

The thickness of the base 6 must be greater than the size of the Larmor radius $r=[(n+1)hc/eB]^{\frac{1}{2}}$, where h is Planck's constant and c is the speed of light and B is the magnetic flux density. When B=10 T, and n=10, r is about 100 Å. Considering the angle $\theta$, lasing transition time and phonon scattering, the thickness of the base is preferably in the range of 100 to 1000 Å. Since the stimulated emission occurs at the cyclotron frequency, which is proportional to the magnetic field strength, the output can be made tunable by adjusting the magnetic field.

The wave length, $\lambda$, of this laser is in the range of approximately 20-200 μm, which is much larger than the thickness of the base, d, where the light is emitted. The wave field outside the base contributes damping, thus raising the threshold emitter current. The preferred wave guiding method is to place the conducting (silver or copper coating) walls 26 against the emitter and collector, respectively. A wave will propagate along the plane defining the base even when $d<<\lambda$ if the wave electric field is normal to the base plane. The conducting walls 26 confine a propagating wave. The mirrors 32 and 34 are placed on two opposite ends of the device in order to form a cavity as shown in FIG. 2. The laser output power comes through the mirror 34.

While preferred embodiments have been illustrated and described herein, there is no intent to limit the scope of invention to those or any other particular embodiments. For example, other narrow band gap semiconductors, such as InAs, CaTe or $Cd_{1-x}Hg_xTe$, could be used in place of InSb. The preferred barrier material herein is $In_{0.7}Ga_{0.3}Sb$, but other ratios of this combination could be used generally with the effect of raising or lowering the barriers. In addition, other barrier materials such as $In_{1-x}Al_xSb$ could be used in the place of InGaSb. Other embodiments may call for biasing voltages outside of the ranges specified for the above preferred embodiment. A preferred embodiment for the case of electrons in the conduction band is described. The invention is also applicable for the case of holes in the valence band. For example, GaAs has a nonparabolic valence band and could be used as the p-doped emitter base and collector. $Ga_{1-x}Al_xAs$ or an intrinsic-n-doped-intrinsic (i-n-i) depression of the valence band could be used for formation of the barriers. As a person skilled in the art will recognize, when the invention is practiced utilizing holes in the valence band, electrons will actually be moving into the base from the collector, but the general principles as described above would still be applicable.

What is claimed is:

1. A solid state cyclotron laser for generating coherent electromagnetic radiation comprising:

a semiconductor assembly comprising an emitter region, a base region and a collector region, each such region comprised of n-doped narrow band gap semiconductor crystal material, first barrier means separating said emitter region and from said base region, second barrier means separating said collector region from said base region, first biasing means for applying negative bias to said emitter region relative to said base region and causing the majority of electrons entering said base region from said emitter region to enter said base region as hot electrons, second biasing means for applying positive bias to said collector region relative to said base region for removing from said base region to said collector region essentially the same number of electrons as enter said base region from said emitter region while restricting to essentially zero the flow of electrons having energies in thermal equilibrium with the crystal lattice of said base region, means for applying in said base region a magnetic flux to cause said hot electrons to gyrate in helical trajectories around the lines of magnetic flux, quantize into Landau levels and generate electromagnetic radiation as said hot electrons go from higher to lower Landau levels, and optical resonant cavity means encompassing said base region for producing coherent electromagnetic radiation from said electromagnetic radiation generated in said base region as said hot electrons go from higher to lower Landau levels.

2. A solid state cyclotron laser for generating coherent electromagnetic radiation comprising:

a semiconductor assembly comprising an emitter region, a base region and a collector region, each such region comprised of p-doped narrow band gap semiconductor crystal lattice material, said emitter region being separated from said base region by first barrier means for restricting the flow of low energy holes from said base region to said emitter region, and said collection region being separated from said base region by second barrier means for restricting the flow of low energy holes from said emitter region to said base region, first biasing means for applying positive bias to said emitter region with respect to said base region, the magnitude of said bias and said first barrier means being chosen to cause the holes entering said base region from said emitter region to enter said base region as hot holes, second biasing means for applying a negative bias to said collector region with respect to said base region so as to remove from said base region to said collector region essentially the same number of holes as enter said base region from said emitter region while restricting to essentially zero the flow of holes having energies in thermal equilibrium with the crystal lattice of said base region, means for applying in said base region a magnetic field having a flux density in excess of 1.0 T to cause said hot holes to gyrate in helical trajectories around the lines of flux of said magnetic field, quantize into Landau levels and radiate as said hot holes go from higher to lower Landau levels, and optical resonance cavity means containing said base region for producing coherent electromagnetic radiation from said electromagnetic radiation produced in said base region as said hot holes go from higher to lower Landau levels.

3. A laser according to claim 1 wherein said emitter, base and collector regions are formed of semiconductor crystal materials selected from the group consisting of InSb, InAs, and $Cd_{1-x}Hg_xTe$.

4. A laser according to claim 1 wherein said first and second barrier materials are formed of semiconductor crystal materials selected from the group consisting of $In_{1-x}Ga_xSb$ and $In_{1-x}Al_xSb$.

5. A laser according to claim 1 wherein said emitter, base and collector regions comprise InSb semiconductor crystal material, and said first and second barrier materials comprise $In_{1-x}Ga_xSb$.

6. A laser according to claim 2 wherein said emitter, base and collector region comprise GaAs and said barrier region is formed of semiconductor crystal materials selected from the group consisting of $Ga_{1-x}Al_xAs$ and materials having an i-n-i depression of the valence band.

7. A laser according to claim 1 wherein said optical resonant cavity means forms a Fabry-Perot cavity.

8. A laser according to claim 2 wherein said optical resonance cavity means forms a Fabry-Perot cavity.

* * * * *

UNITED STATES PATENT AND TRADEMARK OFFICE
CERTIFICATE OF CORRECTION

PATENT NO. : 4,723,250
DATED : February 2, 1988
INVENTOR(S) : T. Ohkawa, et al.

It is certified that error appears in the above-identified patent and that said Letters Patent is hereby corrected as shown below:

In the Abstract:

Abstract, line 12, change "conherent" to --coherent--.

In the Specification:

Column 1, line 16, change "Stimulated" to --"Stimulated--.
        line 18, change "Field," to --Field,"--.
        line 40, after "See" delete the parenthesis.
        line 42, after (1985)" delete the last parenthesis.
        line 58, change "$w_c$" to --$\omega_c$--.

Column 2, line 53, after "$2\mu m$" insert a comma.
        line 54, after "respectively" insert a comma.
Column 3, line 39, change "beween" to --between--.

UNITED STATES PATENT AND TRADEMARK OFFICE
CERTIFICATE OF CORRECTION

PATENT NO. : 4,723,250

DATED : February 2, 1988

INVENTOR(S) : T. Ohkawa, et al.

It is certified that error appears in the above-identified patent and that said Letters Patent is hereby corrected as shown below:

Column 4, line 33, delete "and".

line 34, after "region," insert --and--.

Column 6, line 17, change "region" to --regions--.

Signed and Sealed this

Fifteenth Day of November, 1988

Attest:

Attesting Officer

DONALD J. QUIGG

Commissioner of Patents and Trademarks